United States Patent
Kobayashi et al.

(10) Patent No.: US 7,363,704 B2
(45) Date of Patent: Apr. 29, 2008

(54) RFID TAG AND METHOD OF MANUFACTURING RFID TAG

(75) Inventors: Hiroshi Kobayashi, Kawasaki (JP);
Naoki Ishikawa, Kawasaki (JP);
Takatoyo Yamakami, Kawasaki (JP);
Masumi Katayama, Kawasaki (JP);
Syunji Baba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 180 days.

(21) Appl. No.: 11/007,304

(22) Filed: Dec. 9, 2004

(65) Prior Publication Data

US 2006/0010685 A1 Jan. 19, 2006

(30) Foreign Application Priority Data

Jul. 15, 2004 (JP) ............... 2004-208362

(51) Int. Cl.
*H05K 3/30* (2006.01)
*G06K 19/02* (2006.01)

(52) U.S. Cl. ............... 29/832; 29/827; 29/840; 235/488; 235/492

(58) Field of Classification Search ................ 29/827, 29/832, 840; 235/488, 492
See application file for complete search history.

(56) References Cited

U.S. PATENT DOCUMENTS

| | | | | |
|---|---|---|---|---|
| 5,907,477 A | * | 5/1999 | Tuttle et al. ............... | 361/760 |
| 6,371,380 B1 | | 4/2002 | Tanimura | |
| 6,428,731 B1 | * | 8/2002 | Bernardus Peters et al. ............... | 264/272.13 |
| 2004/0155114 A1 | * | 8/2004 | Rietzler ............... | 235/492 |
| 2006/0237545 A1 | * | 10/2006 | Takahashi et al. ......... | 235/492 |

FOREIGN PATENT DOCUMENTS

| | | |
|---|---|---|
| DE | 44 10 732 C2 * | 5/1997 |
| JP | 2-28340 | 1/1990 |
| JP | 2000-113142 | 4/2000 |
| JP | 2003-223626 | 8/2003 |
| JP | 2003-242471 | 8/2003 |
| JP | 2003-242472 | 8/2003 |
| JP | 2003-276120 | 9/2003 |

* cited by examiner

*Primary Examiner*—C. J. Arbes
(74) *Attorney, Agent, or Firm*—Kratz, Quintos & Hanson, LLP

(57) ABSTRACT

A method of manufacturing an RFID tag includes forming through-holes on a sheet to embed a plurality of electronic components, such as IC chips; forming a substrate by sticking a bottom plate sheet to the sheet, and forming recesses; embedding the electronic components into the recesses; printing antenna patterns on the substrate such that the antenna patterns are connected to electrodes of the electronic components; covering the substrate with a cover sheet; and a slitting step of cutting out individual RFID tags.

8 Claims, 9 Drawing Sheets

FIG.2
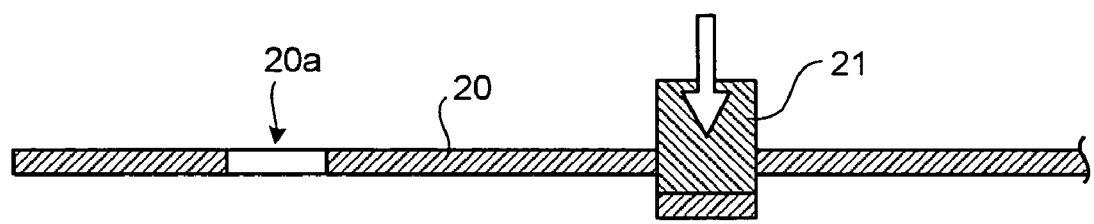
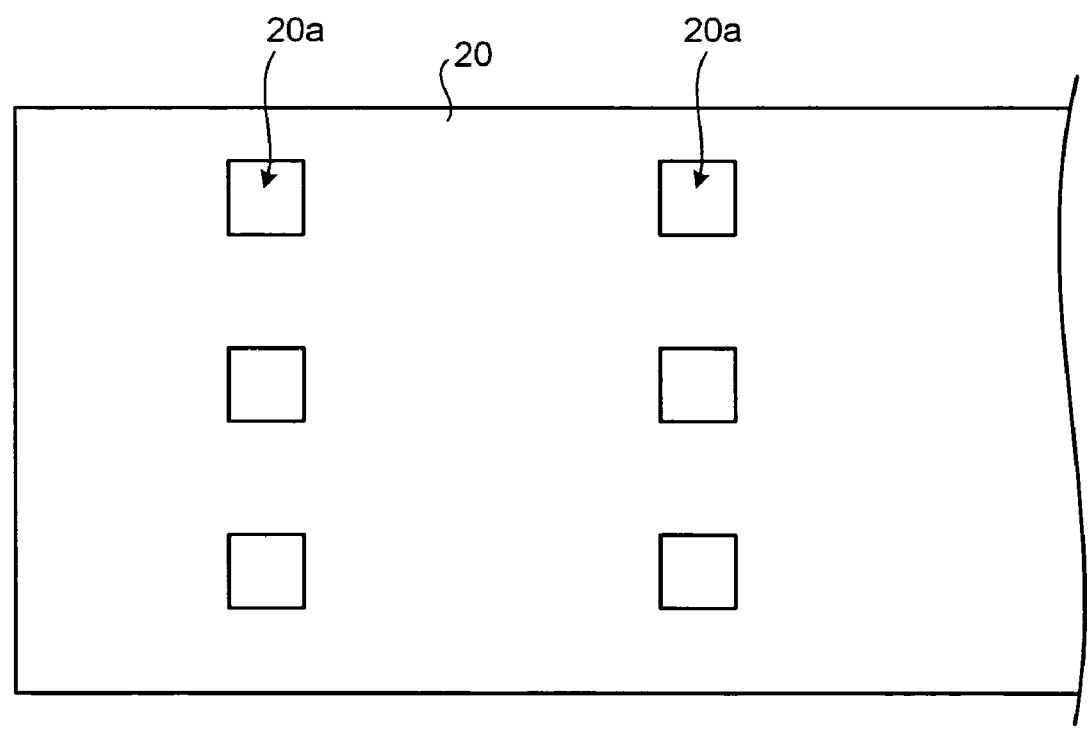

FIG.5
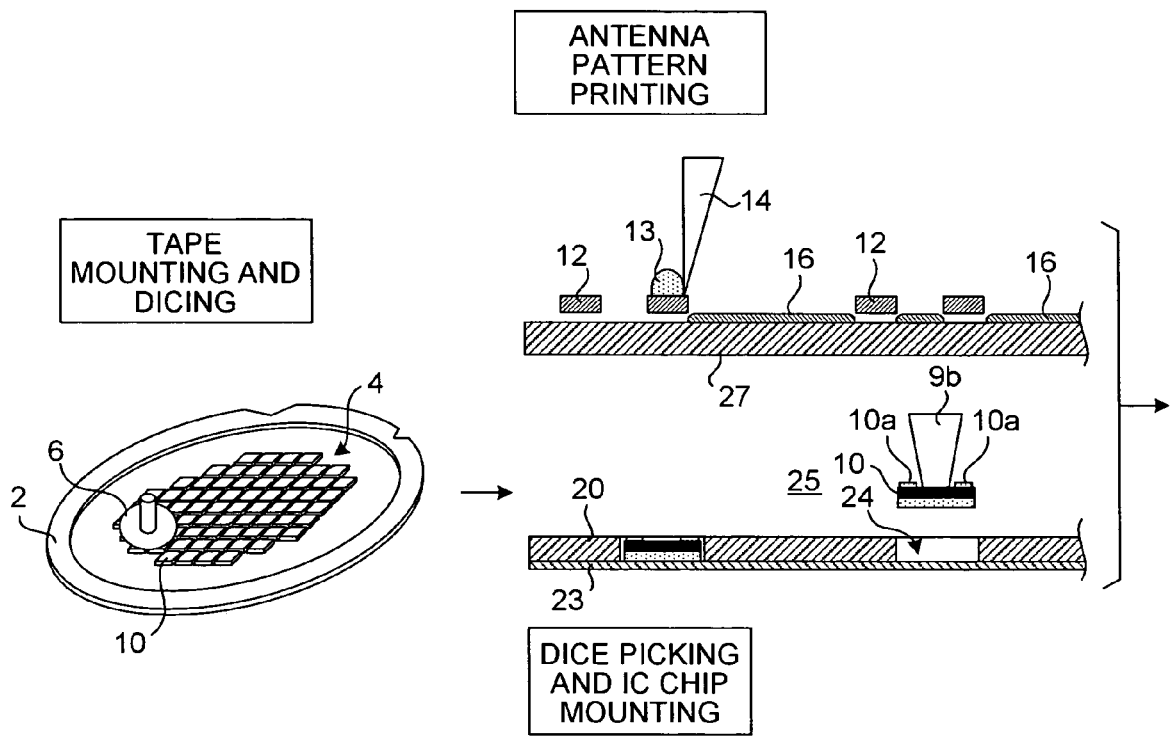
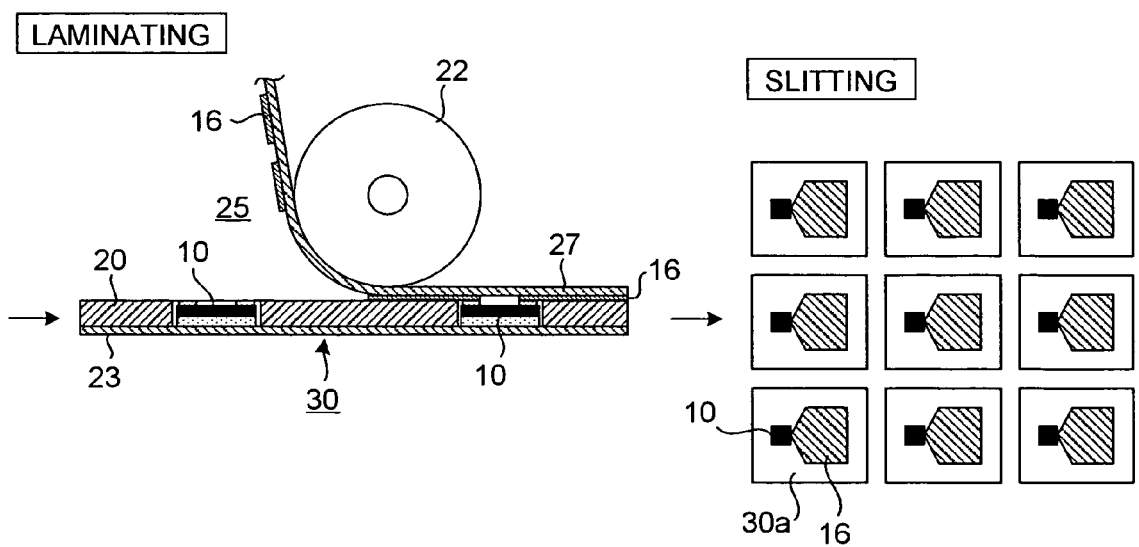

FIG.6
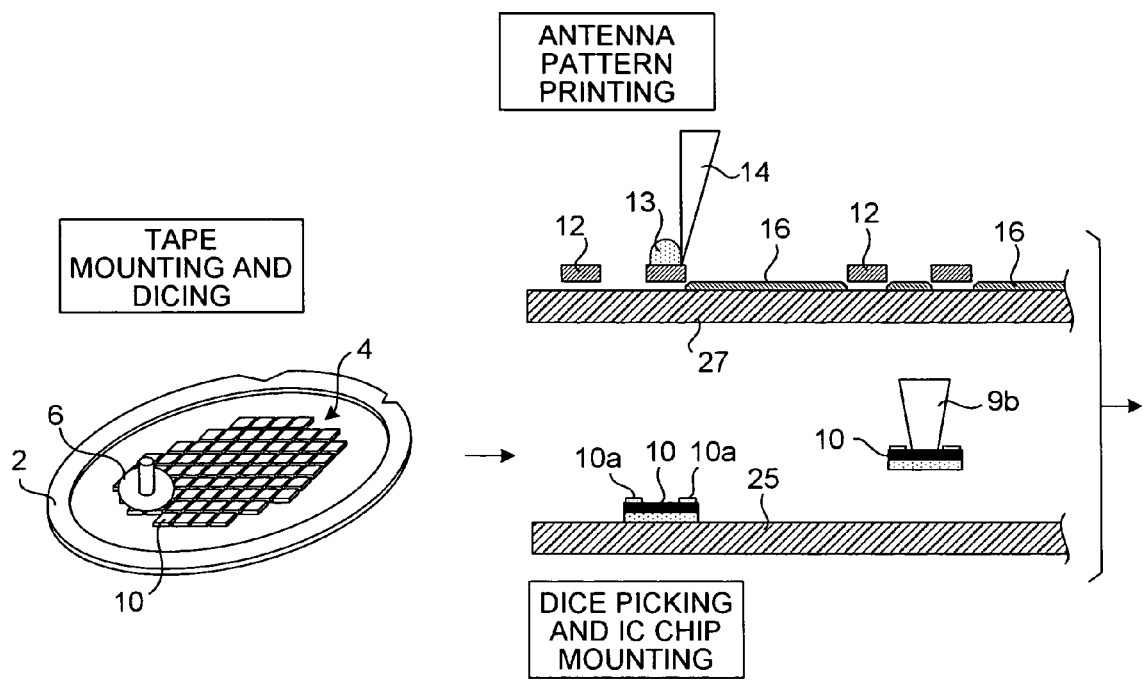
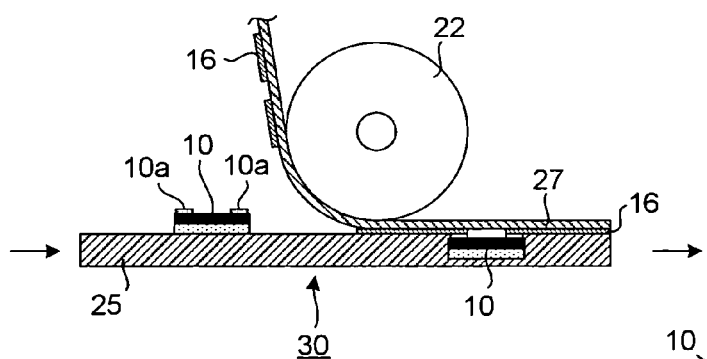
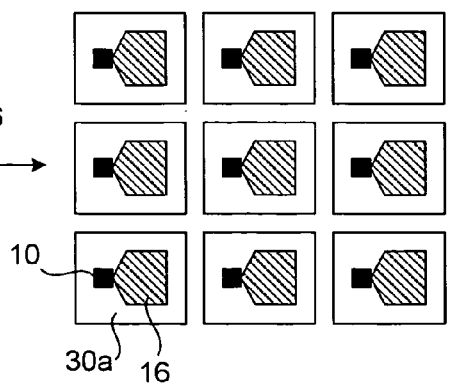

FIG.9
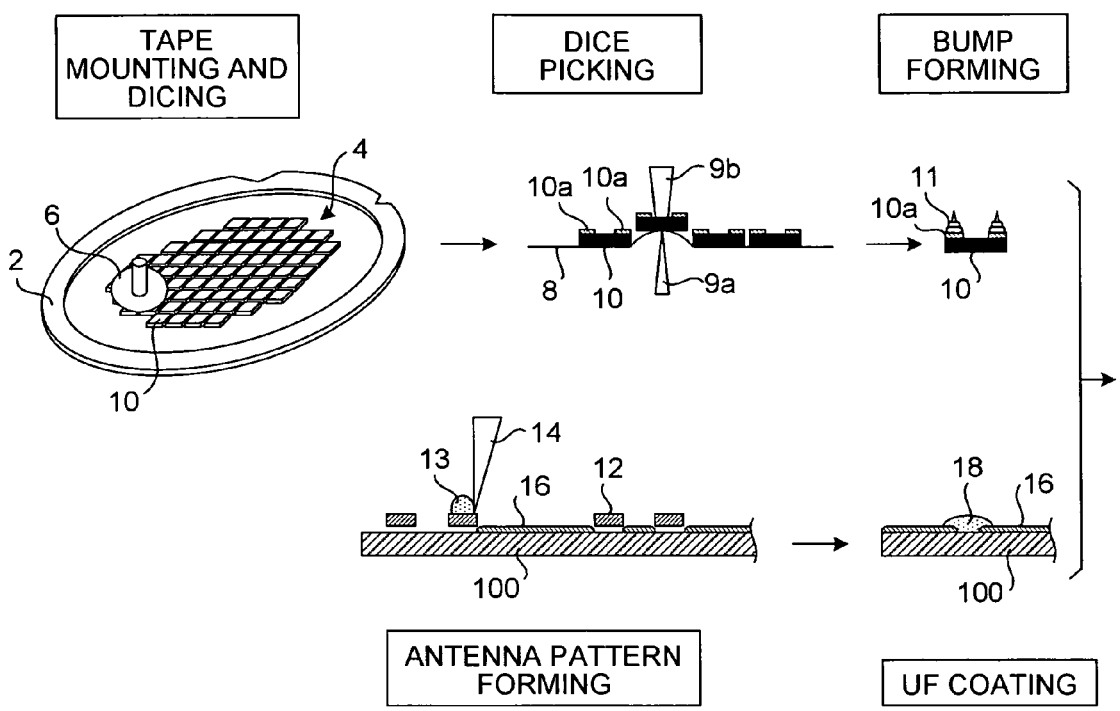
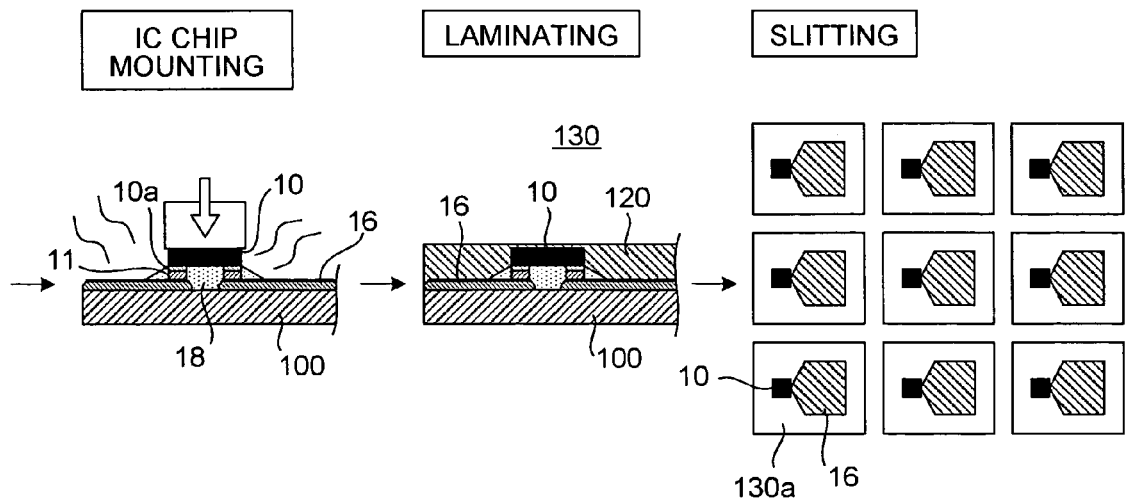

US 7,363,704 B2

RFID TAG AND METHOD OF MANUFACTURING RFID TAG

BACKGROUND OF THE INVENTION

1) Field of the Invention

The present invention relates to radio frequency identification (RFID) tags and a method of manufacturing of the RFID tags.

2) Description of the Related Art

Recently, there is provided an RFID tag such as a non-contact IC card that receives a power supply and information from an external device such as a reader/writer without contact and transmits information to the external device using a radio wave. This RFID tag includes an antenna pattern provided on a plastic or paper base material, and an IC chip. The antenna pattern and a capacity element incorporated in the IC chip form a resonant circuit. The RFID can communicate with the external device by radio through the antenna pattern.

As a method of manufacturing the RFID tag, what is called a flip-chip mounting technique as shown in FIG. 9 is publicly known. An RFID tag as shown in FIG. 10 is manufactured according to this mounting technique. FIG. 9 is an explanatory diagram of a conventional method of manufacturing an RFID tag, and FIG. 10 is a cross-sectional diagram of a conventional RFID tag.

A "tape mounting and dicing step" is first explained. As shown in FIG. 9, a semiconductor wafer 4 undergone a grinding step is fixed with a dicing tape 8 on a table 2. This semiconductor wafer 4 is cut into IC chips with a known dicing device 6, and each IC chip 10 is cut out.

At a "dice picking step" as shown in FIG. 9, each IC chip 10 is extracted from the dicing tape 8 with a pin 9a and an arm 9b of a dice picking device, and is moved to a predetermined position. At a "bump forming step", bumps 11 as connection metal protrusions are formed on a chip electrode 10a of each IC chip 10. Each bump 11 can be formed on a substrate 100 instead of on the chip electrode 10a.

On the other hand, at an "antenna pattern forming step", an antenna pattern 16 is screen printed on the substrate 100. In other words, print masks 12 are disposed at predetermined positions on the substrate 100. A known conductive paste 13 is coated (printed) onto the substrate 100 by moving a squeegee 14, thereby printing the antenna pattern 16 at a necessary position on the substrate 100.

At an "under-fill (UF) coating step", an under-fill 18 to fix and protect the bumps 11 and the IC chip 10 is coated at positions of the substrate 100 where the IC chips 10 are mounted. At a next "IC chip mounting step", the bumps 11 are connected to the antenna pattern 16, and the IC chip 10 is mounted on the substrate 100 such that the chip electrode 10a becomes conductive to the antenna pattern 16.

After the IC chip 10 is mounted on the substrate 100, the substrate 100 is covered with a cover sheet 120 at the next "laminating step". By covering with the cover sheet 120, an aggregate 130 of RFID tags is formed. Simultaneously, each IC chip 10 and each antenna pattern 16 of the aggregate 130 are protected from an external environment such as external force and moisture. At a "slitting step", individual RFID tags 130a are cut out from the aggregate 130 of the RFID tags with a cutter.

Japanese Patent Application Laid-Open No. 2003-242472 discloses a method of manufacturing an RFID tag. This method includes: a step of forming recess corresponding an external shape and a depth of an IC chip at intervals on a running web material; a step of leaving each one IC chip having the external shape and a shape corresponding the depth into the recess of the web material in an engaged state; a step of printing an antenna pattern or a print circuit according to an inkjet method so as to be connected to a chip electrode of the IC chip engaged in the recess; and a step of covering the entire surface including the recess of the web material engaged with the IC chip and printed with the antenna pattern, with a film.

A recess 102 as shown in FIG. 11 is disclosed as the recess of the RFID tag manufactured according to the above method. In other words, the recess 102 to be engaged with the IC chip 10 is formed on the substrate 100 according to an embossing, for example. In this case, a portion where the recess 102 is formed on the substrate 100 is protruded from a back surface of the substrate 100 by a predetermined distance t. FIG. 11 is a cross-sectional diagram of the conventional recess formed by embossing.

According to the above first conventional method of manufacturing an RFID tag, however, the bump 11 needs to be provided on the chip electrode 10a or on the substrate 100. Further, the IC chip 10 must be fixed with the under-fill 18, which is troublesome and costly.

According to the above second conventional method of manufacturing an RFID tag, the external surface of the recess 102 of the manufactured RFID tag protrudes from the back surface of the substrate 100. Since the back surface of the RFID tag is not flat, stress is easily concentrated on the protruded portion when the RFID tag is stuck to a product or the like and used, possibly breaking the RFID tag.

When the RFID tag is stuck to a flat surface of a product or the like with an adhesive or the like, the protruded portion hinders the adhesion, and generates a space between the tag and the stuck surface. Therefore, the RFID tag is easily peeled off from the product.

SUMMARY OF THE INVENTION

It is an object of the present invention to at least solve the problems in the conventional technology.

A method of manufacturing an RFID tag according to an aspect of the present invention includes forming a plurality of through-holes for embedding a plurality of electronic components on a first sheet; forming a substrate by sticking a second sheet to that surface of the first sheet on which the through-holes are formed in the forming, and forming recesses on the substrate at positions where the through-holes are present in the first sheet; mounting electronic components into the recesses of the substrate formed at the forming a substrate such that electrodes of the electronic components face toward openings of the recesses; forming antenna patterns on the substrate such that the antenna patterns are connected to the electrodes; forming an aggregate of RFID tags by placing a cover sheet onto the substrate with the antenna patterns; and cutting out individual RFID tags from the aggregate of RFID tags.

A method of manufacturing an RFID tag according to another aspect of the present invention includes mounting a plurality of electronic components into a plurality of recesses formed on a substrate such that electrodes of the electronic components face toward openings of the recesses; forming antenna patterns on a cover sheet; forming an aggregate of RFID tags by placing the cover sheet onto the substrate such that the electrodes are connected to the antenna patterns on the cover sheet; and cutting out individual RFID tags from the aggregate of RFID tags.

A method of manufacturing an RFID tag according to still another aspect of the present invention includes mounting electronic components onto a substrate made of thermoplastics such that electrodes of the chips point away from the substrate; forming antenna patterns onto a cover sheet made of thermoplastics; forming an aggregate of RFID tags by pressing and bonding, while heating, the substrate and the cover sheet together such that the electrodes are connected to the antenna patterns on the cover sheet; and cutting out individual RFID tags from the aggregate of RFID tags.

A method of manufacturing an RFID tag according to still another aspect of the present invention includes forming recesses into which a plurality of electronic components are to be embedded on opposing surfaces of a substrate and a cover sheet; forming antenna patterns onto respectively the substrate and the cover sheet such that the antenna patterns can be connected to electrodes of the electronic components when the substrate is covered with the cover sheet even when the electronic components are mounted on the recesses of the substrate without a prescription of a front direction or a back direction of the electronic components; mounting the electronic components into the recesses of the substrate; forming an aggregate of RFID tags by placing the cover sheet onto the substrate such that the antenna patterns on the substrate are connected to the antenna patterns on the cover sheet; and cutting out individual RFID tags from the aggregate of RFID tags.

RFID tags and aggregates of RFID tags according to still other aspects of the present invention are manufactured using the above method according to the present invention.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is an explanatory diagram of a step of punching holes on a sheet;

FIG. 5 is an explanatory diagram of a method of manufacturing an RFID tag according to a second embodiment of the present invention;

FIG. 6 is an explanatory diagram of a method of manufacturing an RFID tag according to a third embodiment of the present invention;

FIG. 9 is an explanatory diagram of a conventional method of manufacturing an RFID tag;

DETAILED DESCRIPTION

Exemplary embodiments of the present invention will be explained in detail with reference to the accompanying drawings. Note that the present invention is not limited by the embodiments.

Figure 1:
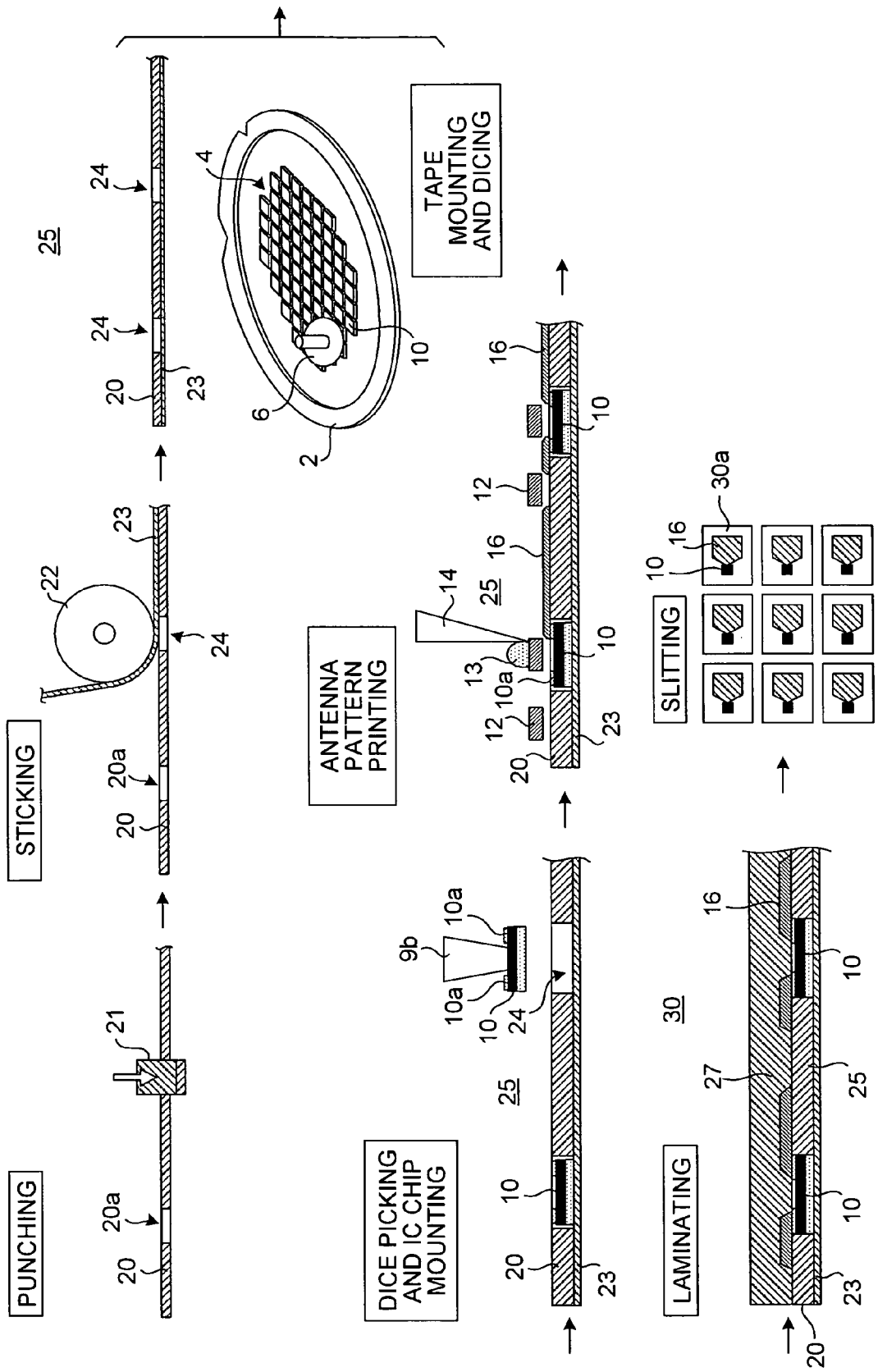
FIG. 1 is an explanatory diagram of a method of manufacturing an RFID tag according to a first embodiment of the present invention.
Figure 3:
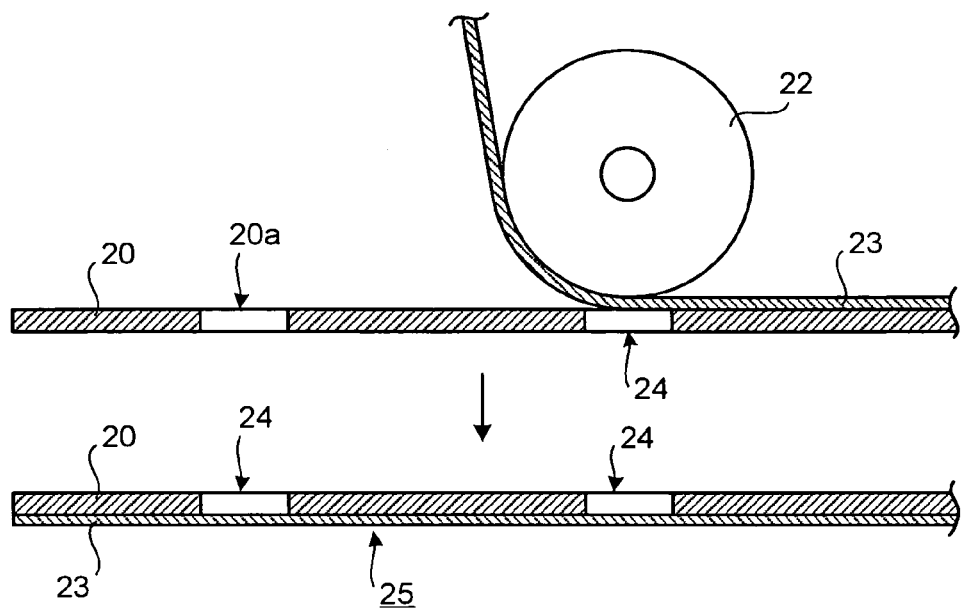
FIG. 3 is an explanatory diagram of a step of forming a recess.
Figure 4:
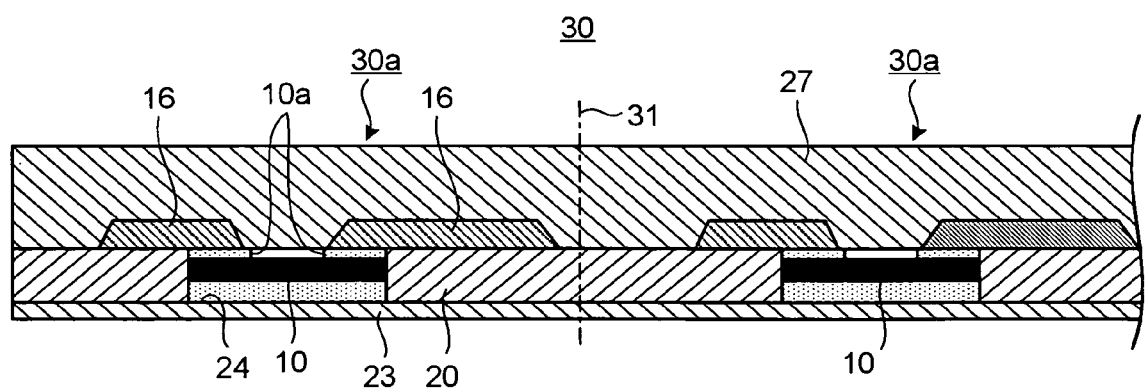
FIG. 4 is a cross-sectional diagram of an aggregate of RFID tags.

FIG. 1 is an explanatory diagram of a method of manufacturing an RFID tag according to a first embodiment of the present invention. FIG. 2 is an explanatory diagram of a step of punching holes on a sheet. FIG. 3 is an explanatory diagram of a step of forming a recess. FIG. 4 is a cross-sectional diagram of an aggregate of RFID tags. Like reference numerals designate like or corresponding parts explained earlier, and a redundant explanation is omitted or is simplified.

A "tape mounting and dicing step" is explained first. As shown in FIG. 1, the semiconductor wafer 4 after a grinding step is fixed with a dicing tape, not shown, on the table 2. The semiconductor wafer 4 is cut into electronic components (hereafter, "IC chips") with a known dicing device 6, and each IC chip 10 is cut out. The IC chip 10 has a circuit and a memory that record and read information without contact, and has a chip electrode 10a to be connected to the antenna pattern 16.

A step of forming a substrate 25 into which the IC chip 10 is embedded is explained next with reference to FIG. 1 and FIG. 2. As shown in the drawings, a sheet 20 is a base material into which the IC chip 10 is embedded, and has substantially the same thickness as a height of the IC chip 10 (a height including the chip electrode 10a).

The sheet 20 is made of flexible thermoplastics. In other words, polyethylene terephthalate (PET), polyimide (PI), polyethylene naphthalate (PEN), or polyvinyl chloride (PVC) can be used for the material of the sheet 20. PET is most suitable for the material of the sheet 20, considering processability, insulation, mechanical strength, and price.

Through-holes 20a of the sheet 20 are formed by punching with a pressing device and the like that has a plurality of punching units 21 as shown in FIG. 2 (a through-hole forming step). Many through-holes 20a are formed at one time in high precision at the through-hole forming step. The size of the through-hole 20a is slightly larger than that of the IC chip 10 to allow the IC chip 10 to be engaged with the through-hole 20a. The through-hole forming step is indicated as "punching step" in FIG. 1.

While the through-hole 20a is formed by punching in the above explanation, the through-hole 20a can be also formed by hollowing the sheet 20 by irradiating laser beams or the like, or cutting (half cutting) the sheet 20 with an end mill or the like, or by chemical processing such as etching. However, etching involves a complex process, and it is hard to adjust the depth according to this method. The half cutting tends to cut too much when forming the through-hole 20a of a large width, and therefore, is not suitable.

As shown in FIG. 3 and FIG. 1, a bottom plate sheet (other sheet) 23 is continuously stuck to one surface of the sheet 20 after the through-hole forming step, with a roller 22. With this arrangement, the substrate 25 can be manufactured efficiently, and a recess 24 can be formed easily at a position where the through-hole 20a is provided (a sticking step). Since the bottom of the recess 24 is formed on the bottom plate sheet 23, the lower surface (a ground surface) of the IC chip 10 embedded in the recess 24 can be protected.

Since the thickness of the sheet 20 is set substantially the same as the height of the IC chip 10 (the height including the chip electrode 10a), the depth of the recess 24 can be set substantially the same as the height of the IC chip 10.

Therefore, when the sheet 20 having a thickness corresponding to the height of the IC chip 10 is prepared, the recess 24 having a proper depth can be formed easily.

The bottom plate sheet 23 is also made of the same kind of thermoplastics as that of the sheet 20. The sheet 20 and the bottom plate sheet 23 are pressed with the roller 22 at a predetermined pressure while heating both sheets at a predetermined temperature. Since both sheets 20 and 23 are fused and integrated together, the substrate 25 can be formed easily. Based on this formation, both the front surface and the back surface of the substrate 25 become flat without a protruded portion.

Consequently, when the back surface of the substrate 25 (the bottom plate sheet 23) is used as a back surface of an RFID tag 30a described later and is stuck to a predetermined article, no stress is concentrated on this back surface. This is considerably advantageous to secure mechanical strength.

At the time of screen printing the antenna pattern 16 onto the surface of the substrate 25 (the surface of the sheet 20) at an antenna pattern printing step described later, since a disposition of the printing mask 12 or a move of the squeegee 14 is not hindered owing to the absence of the protruded portion, the printing can be performed smoothly. Since the substrate 25 has a flat surface, a semifluid conductive paste can be provided on the substrate 25 just like stamping. The antenna pattern 16 can be formed by solidifying this conductive paste.

When the sheet 20 and the bottom plate sheet 23 are made of different kinds of thermoplastics or when one of them is made of a material other than thermoplastics (such as paper), a predetermined adhesive is coated on both surfaces of these sheets 20 and 23, which are then pressed together to stick the sheets together.

As shown in a "dice picking and IC chip mounting step" in FIG. 1, the IC chip 10 is moved from the table 2 and is embedded into the recess 24 of the substrate 25 formed at the sticking step, with the arm 9b of a dice picking device, not shown, (the IC chip mounting step). The IC chip 10 is mounted such that the chip electrode 10a of the IC chip 10 faces the opening of the recess 24. The IC chip 10 can be provisionally stopped within the recess 24 with a predetermined adhesive, when necessary.

An "antenna pattern printing step (an antenna pattern forming step)" shown in FIG. 1 is explained next. As shown in FIG. 1, the chip electrode 10a of the IC chip 10 is exposed from the recess 24 of the substrate 25 after the IC chip mounting step, to form the same height as that of the surface of the substrate 25. The antenna pattern 16 is printed on the substrate 25 so as to be connected to the chip electrode 10a exposed to the recess 24.

A screen printing using the conductive paste 13 can be employed, as an example, for the printing. In other words, the printing mask 12 is disposed at a predetermined position on the substrate 25, and the known conductive paste 13 is coated (printed) onto the substrate 25 by moving the squeegee 14. As a result, the antenna pattern 16 is printed at a necessary position on the substrate 25.

At the printing step, the printing of the antenna pattern 16 to the substrate 25 and the connection (conduction) between the chip electrode 10a and the antenna pattern 16 can be carried out simultaneously. Therefore, processing steps can be decreased, and manufacturing cost can be lowered. An inkjet printing system can be employed to print the antenna pattern 16 onto the substrate 25.

A "laminating step" shown in FIG. 1 is explained next. As shown in FIG. 1 and FIG. 4, at the laminating step, the substrate 25 formed with the antenna pattern 16 is covered with a cover sheet 27, thereby protecting the IC chip 10 and the antenna pattern 16 provided on the substrate 25 from an external environment such as external force and moisture. The aggregate 30 of RFID tags 30a can be formed at this laminating step. The aggregate 30 of the RFID tags includes a large number of the same RFID tags 30a formed in a longitudinal direction and a width direction.

The cover sheet 27 is made of the same kind of thermoplastics as that of the substrate 25. The substrate 25 and the cover sheet 27 are pressed with a roller, not shown, at a predetermined pressure while heating them at a predetermined temperature. Since the substrate 25 and the cover sheet 27 are fused, the substrate 25 can be covered with the cover sheet 27 easily.

When the substrate 25 and the cover sheet 27 are made of different kinds of thermoplastics or when one of them is made of a material other than thermoplastics (such as paper), a predetermined adhesive is coated on both surfaces of the substrate 25 and the cover sheet 27, which are then pressed together to stick the sheets together.

A "slitting step" shown in FIG. 1 is explained next. At the slitting step, the individual RFID tags 30a are cut out from the aggregate 30 of the RFID tags with a known cutter. For example, when the aggregate 30 of the RFID tags shown in FIG. 4 is cut at a position of a cut line 31, the aggregate 30 can be divided in a width direction (a direction perpendicular to a paper surface shown in FIG. 4). When the aggregate 30 divided in the width direction is further cut by a predetermined number of times in a longitudinal direction (a lateral direction of the paper surface shown in FIG. 4), the individual RFID tags 30a can be obtained.

As explained above, according to the conventional method of manufacturing an RFID tag, the bump 11 is formed on the chip electrode 10a of the IC chip 10, and the under-fill 18 is coated onto the substrate to fix the IC chip 10. On the other hand, according to the method of manufacturing an RFID tag according to the first embodiment, the bump forming step and the under-fill coating step which are conventionally required become unnecessary. Further, the printing of the antenna pattern 16 to the substrate 25 and the connection (conduction) between the chip electrode 10a and the antenna pattern 16 can be carried out simultaneously. Therefore, the processing steps can be decreased substantially, and the manufacturing cost can be lowered. Since the configuration of the RFID tag 30a is simplified, the reliability of the RFID tag improves.

Since the front and back surfaces of the RFID tag 30a manufactured according to the above manufacturing method are flat, the following characteristics are provided: (1) stress is not easily applied (concentrated) to the RFID tag 30a; (2) thicknesses of the substrate 25 and the cover sheet 27 can be changed optionally, and their materials can be changed; and (3) the RFID tag 30a has a pleasant texture when touched on a human body, since both the front and the back surfaces of the RFID tag 30a are flat.

Therefore, the RFID tag 30a can be used for the following items by taking advantage of the above characteristics.

(1) IC Card

By increasing the thickness of the substrate 25 and the cover sheet 27 to be stuck together, the configuration of the RFID tag 30a can be applied to the IC card as it is.

(2) Tag Portion of Clothes

The RFID tag can be used for a tag of clothes on which manufacture name, cleaning method, and the like are described. Since the RFID tag 30a has flat surfaces on both sides without a protrusion, a thin RFID tag avoids discomfort and does not spoil the pleasant texture on the skin, even when the RFID tag is provided on the inside of clothes touching the skin. Since the RFID tag 30a has no protrusion, this does not snag on clothes.

(3) Glass, Ceramic, Etc.

Since the RFID tag 30a has no protrusion, stress is not easily concentrated on the RFID tag 30a even if external force is applied to the tag. Therefore, the RFID tag 30a can be stuck to a glass cup or on a curved surface of ceramic and the like which are fragile.

(4) Mat, Carpet, Etc.

Since the RFID tag 30a has no protrusion, stress is not concentrated when it is stepped on. On the contrary, stress is dispersed and mitigated. Therefore, the IC chip 10 within the RFID tag 30a is not easily broken. Therefore, the RFID tag can be used for a mat, a carpet, and the like.

(5) Paper Product Such as Book

When the RFID tag having a protrusion is stuck to paper, and if this paper having the RFID tag and other paper are superimposed together, a deformation and a wrinkle may be formed at the superimposed portion. The RFID tag 30a according to the first embodiment has flat surfaces, and does not cause such a problem. Therefore, the RFID tag can be used for a paper product such as a book.

A device that sticks a barcode or a price tag can be used as it is for the RFID tag 30a according to the first embodiment. Therefore, there is an advantage that no additional investment is required.

FIG. 5 is an explanatory diagram of a method of manufacturing an RFID tag according to a second embodiment of the present invention. As shown in FIG. 5, this method includes a dice picking and IC chip mounting step (an IC chip mounting step) of embedding the IC chips 10 into a plurality of recesses 24 provided on the substrate 25 such that each chip electrode 10a of each IC chip 10 faces the opening of the recess 24, an antenna pattern printing step (an antenna pattern forming step) of screen printing the antenna pattern 16 onto the cover sheet 27 to cover the substrate 25 mounted with the IC chips 10, a laminating step of forming the aggregate 30 of RFID tags by covering the substrate 25 with the cover sheet 27 such that the chip electrodes 10a exposed to the recess 24 of the substrate 25 are connected to the antenna patterns 16 formed on the cover sheet 27, and a slitting step (a cutting step) of cutting out the individual RFID tags 30a from the aggregate 30 of the RFID tags.

In the method according to the first embodiment, the cover sheet 27 is laminated onto the substrate 25 after the antenna pattern 16 is printed onto the substrate 25 that is mounted with the IC chip 10. On the other hand, in the method according to the second embodiment, the cover sheet 27 printed with the antenna pattern 16 is laminated onto the substrate 25 that is mounted with the IC chip 10.

Contents of the tape mounting and dicing step, the step of forming the substrate 25, the step of printing the antenna pattern onto the cover sheet 27, the dice picking and IC chip mounting step, the laminating step, and the slitting step are substantially the same as those according to the first embodiment. Therefore, redundant explanation is omitted.

As explained above, according to the method of manufacturing an RFID tag according to the second embodiment, the bump forming step and the under-fill coating step that are necessary according to the conventional manufacturing method become unnecessary. Further, the connection (conduction) between the chip electrode 10a and the antenna pattern 16, and the laminating of the cover sheet 27 to the substrate 25 can be achieved simultaneously at the laminating step. Therefore, the processing steps can be decreased substantially, and the manufacturing cost can be lowered.

The RFID tag 30a according to the second embodiment also has the same characteristics as those of the RFID tag 30a according to the first embodiment, and, therefore, can be also applied to similar-items.

While the cover sheet 27 is continuously stuck to the substrate 25 with the roller 22 at the laminating step according to the second embodiment, the sticking method is not limited to this. For example, the cover sheet 27 can be vertically covered onto the substrate 25 by pressing with a pressing device, not shown, while heating the cover sheet 27. An inkjet printing system can be also employed to print the antenna pattern 16 onto the cover sheet 27.

FIG. 6 is an explanatory diagram of a method of manufacturing an RFID tag according to a third embodiment of the present invention. As shown in FIG. 6, the method of manufacturing an RFID tag according to the third embodiment includes a dice picking and IC chip mounting step (an IC chip mounting step) of mounting the IC chips 10 onto the substrate 25 made of thermoplastics such that each chip electrode 10a faces opposite to the substrate 25, an antenna pattern printing step (an antenna pattern forming step) of screen printing the antenna patterns 16 onto the cover sheet 27 made of thermoplastics, a laminating step of forming the aggregate 30 of RFID tags by embedding the IC chips 10 into the substrate 25 by pressing and bonding the substrate 25 and the cover sheet 27 while heating them such that the chip electrodes 10a on the substrate 25 and the antenna patterns 16 on the cover sheet 27 are connected together, and a slitting step (a cutting step) of cutting out the individual RFID tags 30a from the aggregate 30 of the RFID tags.

While the recess 24 is formed onto the substrate 25 in advance according to the method of manufacturing an RFID tag in the second embodiment, an RFID tag is manufactured by a different method according to the third embodiment as follows. The IC chip 10 is mounted onto the substrate 25 that is not formed with the recess 24, and the IC chip 10 is embedded into the substrate 25 by pressing and bonding the cover sheet 27 printed with the antenna pattern 16 and the substrate 25 together while heating the cover sheet 27 and the substrate 25.

Materials of the substrate 25 and the cover sheet 27, and heating and pressing conditions at the laminating step are selectively set such that the IC chip 10 is not broken at the pressing and bonding time. In order to prevent a positional deviation of the IC chip 10 at the embedding time, the IC chip 10 can be provisionally fixed to the substrate 25 with a predetermined adhesive when necessary.

Contents of the tape mounting and dicing step, the step of printing the antenna pattern onto the cover sheet 27, the dice picking and IC chip mounting step, and the slitting step are substantially the same as those according to the first embodiment. Therefore, redundant explanation is omitted.

As explained above, according to the method of manufacturing an RFID tag according to the third embodiment, the bump forming step and the under-fill coating step that are necessary according to the conventional manufacturing method become unnecessary. Further, the step of forming the recess 24 onto the substrate 25 becomes unnecessary. Therefore, the processing steps can be decreased further from the steps according to the second embodiment and the manufacturing cost is lowered. The RFID tag 30a according to the third embodiment also has the same characteristics as those of the RFID tag 30a according to the first embodiment, and, therefore, can be also applied to similar items.

While the cover sheet 27 is continuously stuck to the substrate 25 with the roller 22, and the IC chip 10 is embedded into the substrate 25 at the laminating step according to the third embodiment, the sticking method is not limited to this. For example, the cover sheet 27 can be vertically pressed from above the substrate 25 with a pressing device, not shown, thereby embedding the IC chip 10 into the substrate 25 and covering the substrate 25 with the cover sheet 27.

Figure 7:
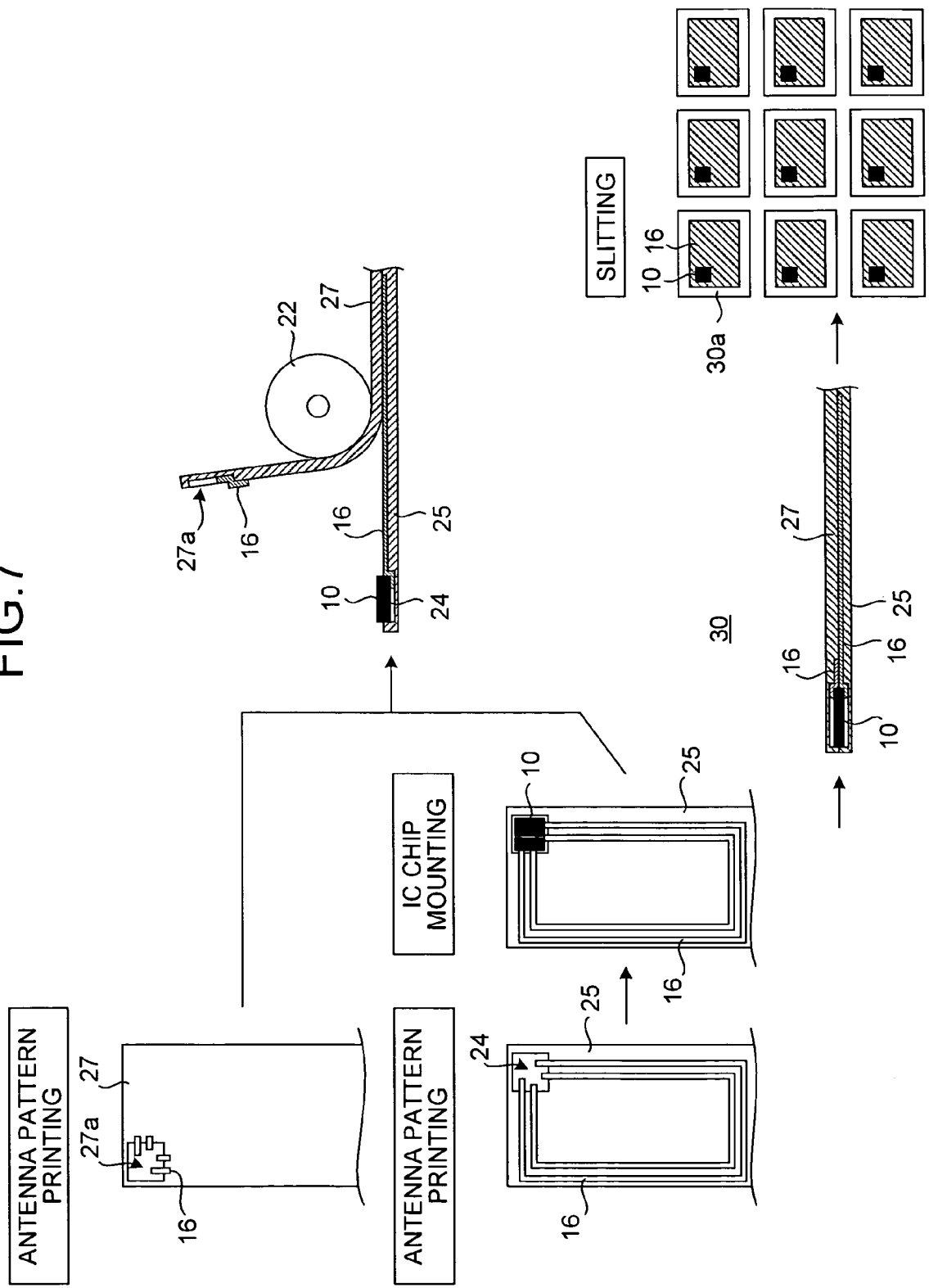
FIG. 7 is an explanatory diagram of a method of manufacturing an RFID tag according to a fourth embodiment of the present invention.
Figure 8:
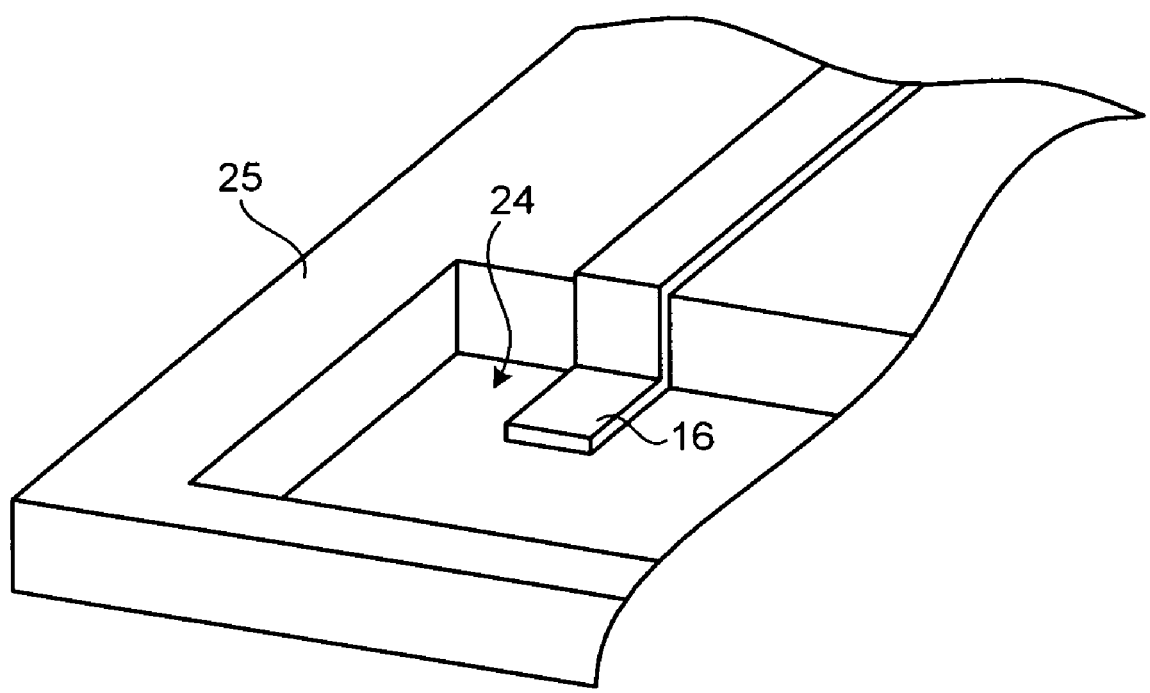
FIG. 8 is a perspective diagram of an antenna pattern that is printed on a recess of a substrate.
Figure 10:
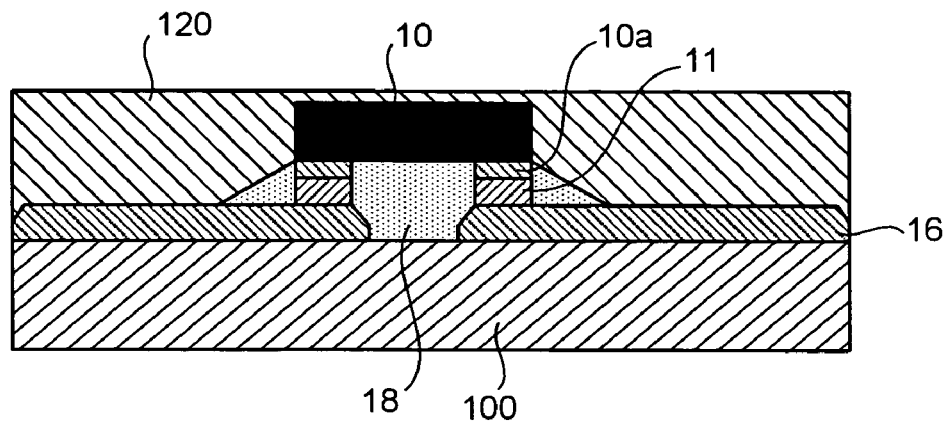
FIG. 10 is a cross-sectional diagram of a conventional RFID tag.
Figure 11:
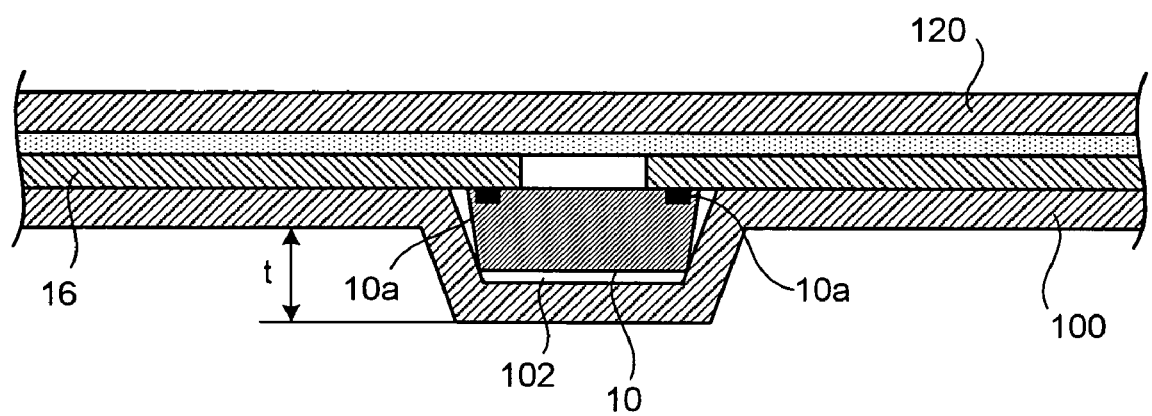
FIG. 11 is a cross-sectional diagram of a conventional embossed recess.

FIG. 7 is an explanatory diagram of a method of manufacturing an RFID tag according to a fourth embodiment of the present invention. FIG. 8 is a perspective diagram of an antenna pattern that is printed on a recess of a substrate.

As shown in FIG. 7, the method of manufacturing an RFID tag according to the fourth embodiment includes a recess forming step (not shown) of forming recesses 24 and 27a into which the IC chips 10 are to be embedded, on opposite surfaces of the substrate 25 and the cover sheet 27 to be stuck together, an antenna pattern printing step (an antenna pattern forming step) of printing the antenna patterns 16 onto the substrate 25 and the cover sheet 27 such that the antenna patterns 16 can be connected to the chip electrodes 10a of the IC chips 10 when the substrate 25 is covered with the cover sheet 27 even when the IC chips 10 are mounted on the recesses 24 of the substrate 25 without a prescription of a front direction or a back direction of the IC chips 10, an IC chip mounting step of embedding the IC chips 10 into the recesses 24 of the substrate 25, a laminating step of forming the aggregate 30 of RFID tags by covering the substrate 25 with the cover sheet 27 such that the antenna patterns 16 on the substrate 25 mounted with the IC chips 10 are connected to the antenna patterns 16 on the cover sheet 27, and a slitting step (a cutting step) of cutting out the individual RFID tags 30a from the aggregate 30 of the RFID tags.

FIG. 8 is a partially enlarged diagram of the antenna pattern 16 that is extended to the recess 24. This kind of antenna pattern 16 is also extended to the recess 27a, of which detailed diagram is omitted. The antenna patterns 16 and 16 of the opposite recesses 24 and 27a are connected together with a predetermined conductive paste (such as silver paste).

The antenna patterns 16 corresponding to the chip electrodes 10a are extended to the recesses 24 and 27a. Therefore, even when the IC chip 10 is embedded into the recess 24 without a prescription of a front direction or a back direction of the IC chip 10, conduction between the chip electrode 10a and the antenna pattern 16 can be always obtained.

Contents of the tape mounting and dicing step, the step of printing the antenna pattern onto the substrate 25 and the cover sheet 27, the IC chip mounting step, the laminating step, and the slitting step are substantially the same as those according to the first embodiment. Therefore, redundant explanation is omitted. The recess 24 of the substrate 25 and the recess 27a of the cover sheet 27 can be formed in a similar manner to that of forming the recess 24 according to the first embodiment, and therefore, redundant explanation is omitted.

As explained above, according to the method of manufacturing an RFID tag according to the fourth embodiment, the bump forming step and the under-fill coating step that are necessary according to the conventional manufacturing method become unnecessary. Further, the connection (conduction) between the chip electrode 10a and the antenna pattern 16, and the laminating of the cover sheet 27 to the substrate 25 can be achieved simultaneously at the laminating step. Therefore, the processing steps can be decreased substantially, and the manufacturing cost can be lowered.

Even when the IC chip 10 is embedded into the recess 24 without a prescription of a front direction or a back direction of the IC chip 10, conduction between the chip electrode 10a and the antenna pattern 16 can be always obtained. Therefore, a highly reliable RFID tag 30a can be obtained. The RFID tag 30a according to the fourth embodiment also has the same characteristics as those of the RFID tag 30a according to the first embodiment, and, therefore, can be also applied to similar items.

While the cover sheet 27 is continuously stuck to the substrate 25 with the roller 22 at the laminating step according to the fourth embodiment, the sticking method is not limited to this. For example, the cover sheet 27 can be vertically covered onto the substrate 25 by pressing with a pressing device not shown, while heating the cover sheet 27. An inkjet printing system can be also employed to print the antenna pattern 16 onto the substrate 25 and the cover sheet 27.

According to one aspect of the present invention, the bump forming step and the under-fill coating step conventionally required are not necessary. The printing of the antenna pattern to the substrate, and the connection (conduction) between the chip electrode and the antenna pattern can be carried out simultaneously.

According to another aspect of the present invention, the bump forming step and the under-fill coating step conventionally required are not necessary. The printing of antenna pattern to the substrate, and the connection (conduction) between the chip electrode and the antenna pattern can be carried out simultaneously.

According to still another aspect of the present invention, the bump forming step and the under-fill coating step conventionally required are not necessary. Further, the formation of a recess onto the substrate is not necessary.

According to still another aspect of the present invention, the bump forming step and the under-fill coating step conventionally required are not necessary. The printing of the antenna pattern to the substrate, and the connection (conduction) between the chip electrode and the antenna pattern can be carried out simultaneously. Even when the IC chip is mounted on the recess without a prescription of a front direction or a back direction of the IC chip, conduction between the chip electrode and the antenna pattern can be always obtained. Therefore, a highly reliable RFID tag can be obtained.

According to still another aspect of the present invention, a substrate that has a recess can be formed easily, and the bottom surface of the substrate can be made flat. When a sheet having a thickness corresponding to a height of the IC chip is prepared for the sheet to be provided with through-holes, a recess having a suitable depth can be formed easily.

According to still another aspect of the present invention, many through-holes can be formed at one time in high precision.

According to still another aspect of the present invention, it is possible to select a low-price material that can be easily processed and that can secure insulation and mechanical strength.

According to still another aspect of the present invention, members can be easily stuck together by heating and pressing, and, therefore, can be easily processed.

According to still another aspect of the present invention, a sheet member can be continuously and efficiently pressed.

According to still another aspect of the present invention, an antenna pattern can be printed in high precision in a short time, even when an antenna pattern formation range is large.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing an RFID tag, comprising:
    forming a plurality of through holes for embedding a plurality of electronic components on a first sheet;
    forming a substrate by sticking a second sheet to that surface of the first sheet on which the through holes are formed in the forming, and forming recesses on the substrate at positions where the through holes are present in the first sheet;
    mounting electronic components into the recesses of the substrate formed at the forming a substrate such that electrodes of the electronic components face toward openings of the recesses;
    forming antenna patterns on the substrate such that the antenna patterns are connected to the electrodes;
    forming an aggregate of RFID tags by placing a cover sheet onto the substrate with the antenna patterns; and
    cutting out individual RFID tags from the aggregate of RFID tags,
    wherein said cover sheet completing surrounds said antenna patterns, leaving no gaps and comes in direct contact with the substrate having the recesses containing the electronic components.

2. The method of manufacturing an RFID tag according to claim 1, wherein the forming the through-holes includes punching the first sheet with a pressing device.

3. The method of manufacturing an RFID tag according to claim 1, wherein the substrate and the cover sheet are made of thermoplastics.

4. The method of manufacturing an RFID tag according to claim 3, wherein the forming an aggregate of RFID tags includes bonding the substrate and the cover sheet by heating and pressing.

5. The method of manufacturing an RFID tag according to claim 1, wherein the forming an aggregate of RFID tags includes bonding the substrate and the cover sheet with an adhesive and pressing the substrate and the cover sheet together.

6. The method of manufacturing an RFID tag according to claim 4, wherein the pressing includes continuously pressing with a roller.

7. The method of manufacturing an RFID tag according to claim 1, wherein the forming antenna pattern includes performing screen printing corresponding to the antenna patterns with a conductive paste.

8. The method of manufacturing an RFID tag according to claim 1, wherein the mounting electronic components includes provisionally fixing the electronic components and then permanently fixing the electronic components.

* * * * *